(12) United States Patent
Sato et al.

(10) Patent No.: US 7,257,138 B2
(45) Date of Patent: Aug. 14, 2007

(54) OPTOELECTRONIC WAVEGUIDING DEVICE, STRUCTURAL BODY INCLUDING THE SAME, AND OPTICAL MODULE

(75) Inventors: Hiroshi Sato, Kokubunji (JP);
Masahiro Aoki, Kokubunji (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 807 days.

(21) Appl. No.: 10/608,011

(22) Filed: Jun. 30, 2003

(65) Prior Publication Data

US 2005/0195876 A1   Sep. 8, 2005

(30) Foreign Application Priority Data

Aug. 28, 2002   (JP)   ............................. 2002-247967

(51) Int. Cl.
  *H01S 5/00*   (2006.01)
  *H01S 3/04*   (2006.01)
  *G02B 6/12*   (2006.01)
(52) U.S. Cl. .................. 372/36; 372/44.01; 372/46.01; 385/14
(58) Field of Classification Search .................. 372/36, 372/43.01, 44.01, 46.01; 385/14, 49, 88–94
See application file for complete search history.

(56) References Cited

U.S. PATENT DOCUMENTS

| 4,161,701 | A | * | 7/1979 | Takeda et al. ................. 372/36 |
| 5,729,561 | A | * | 3/1998 | Hironaka ....................... 372/36 |
| 6,404,792 | B1 | * | 6/2002 | Yamamoto et al. ...... 372/46.01 |
| 6,967,980 | B2 | * | 11/2005 | Kawai ....................... 372/43.01 |
| 2001/0032985 | A1 | * | 10/2001 | Bhat et al. ..................... 257/88 |

FOREIGN PATENT DOCUMENTS

| JP | 11-87849 | 3/1999 |
| JP | 2001-144381 | 5/2001 |
| JP | 2002-204030 | 7/2002 |

OTHER PUBLICATIONS

1997 General Conference of the Institute of Electronics, Information and Communication Engineers, Proceedings, Lecture Nos. C3-65.
1997 General Conference of the Institute of Electronics, Information and Communication Engineers, Proceedings, Lecture Nos. C3-68.
Journal of Electronics Materials, vol. 27, No. 2, 1998, pp. 89-95.

* cited by examiner

*Primary Examiner*—Hemang Sangahvi
(74) *Attorney, Agent, or Firm*—Mattingley, Stanger, Malur & Brundidge, P.C.

(57) ABSTRACT

The semiconductor optical device is mounted junction down on a mounting plate via the solder metal of the mounting plate. The electrode of the semiconductor optical device facing the mounting plate is partially coated with a dielectric film and the dielectric film is in contact with the solder metal on the mounting plate.

The reaction between the semiconductor optical device and the solder metal of the mounting plate can be suppressed without deteriorating the thermal conductivity between the semiconductor optical device and the mounting plate. Therefore, it is possible to improve the reliability of the semiconductor optical device mounted in the junction down form since diffusion of the solder metal into the semiconductor can be prevented.

5 Claims, 8 Drawing Sheets

OPTOELECTRONIC WAVEGUIDING DEVICE, STRUCTURAL BODY INCLUDING THE SAME, AND OPTICAL MODULE

BACKGROUND OF THE INVENTION

1. Field of the Invention

The present invention relates to structure of an optical device, such as a semiconductor laser, and structure for mounting the optical device.

2. Related Art

In an optical fiber communication system, optical modules occupy a large part of the parts cost. To lower the price of an optical module, in particular, it is very significant to simplify the mounting of the optical device in the optical module. Accordingly, there have been several simple mounting methods known widely. Their mainstream is to mount a semiconductor laser junction down on a simple mount in an optical module. For example, such simple mounting structures were reported in the 1997 General Conference of the Institute of Electronics, Information and Communication Engineers, Proceedings, Lecture Nos. C3-65, CS-68, etc.

When a semiconductor laser is mounted junction down, the semiconductor laser is bonded to a simple optical device mounting plate made of Si or the like via a solder metal. In this junction down mounting, reliability of the semiconductor laser may deteriorate if reaction advances between the solder metal and the electrode metal of the semiconductor laser. This is attributable to some factors. One is stress acting in the active layer and absorption layer of the optical device as described in Japanese Patent Laid-open No. 11-87849. Another is metal diffusion into the semiconductor as described in public documents such as Journal of Electron Material, vol. 27 (1998), p. 89-95. Metal may diffuse into the semiconductor and further penetrates into the active layer, causing defects there which may deteriorate the device's characteristics.

In order to secure the life of the optical device by suppressing such reaction/diffusion between the electrode metal and the solder metal, there have been several methods proposed and known. They includes (1) suppressing the diffusion of the solder metal by inserting Ti or Pt in the electrode of the optical device and (2) suppressing reaction between the electrode of the optical device and the solder metal.

Of them, in the case of approach (1) where Ti or Pt is inserted to prevent metal diffusion, its effect may be not sufficient depending on the device structure. For example, a ridge waveguide type laser may have an uneven surface. If the surface has large up and down features, it is not possible to coat the surface with a uniform Ti or Pt layer as the case may be. If the Ti or Pi layer is locally thin or absent in a certain area, it is not possible to prevent the solder metal from penetrating through this area. Although the unevenness may be compensated for by thickening the Ti or Pt layer, reliability of the semiconductor laser may deteriorate since thickening the Ti or Pt layer causes larger stress.

In the case of approach (2), several solutions could be conceivable. For example, a widely known structure proposed in Japanese Patent Laid-open No. 11-87849 has a void in the solder metal layer formed on the mounting plate. Since the void is positioned near to the optical device's active region or absorption layer, reaction between the electrode metal of the optical device and the solder metal is suppressed. Specifically, a dielectric film is formed both on the surface of the optical device to be mounted and the solder metal surface of the mounting plate so that the electrode of the optical device does not come into contact with the solder metal. As a matter of course, this structure can effectively block metal penetration into the active region. However, the void formed near the active region produces a new problem with thermal conductivity due to lack of contact with the mounting plate.

This problem is described below.

Injecting current in a semiconductor laser generates heat. For the semiconductor laser to operate steadily, it is necessary to quickly dissipate the heat from the active region. However, forming a void above the active layer stripe, like in the example mentioned above, lowers the thermal conductivity from the active region and therefore raises the temperature of the active region of the semiconductor laser. As a result, this causes such problems as the necessity of increasing the operating current of the semiconductor laser. For practical use, the structure must not only suppress the reaction between the electrode metal of the optical device and the solder metal of the mounting plate but also have good thermal conductivity.

SUMMARY OF THE INVENTION

The inventors of the present invention provide a structure which not only suppresses reaction between the electrode metal of an optical device and the solder metal of a mounting plate but also satisfactorily dissipate heat from an active region. Specifically, the surface of the optical device is partially coated with a dielectric film and the optical device is mounted on the solder metal with a waveguide of the optical device bought into contact with the solder metal so that the reaction between the solder metal and the electrode of the optical device can be suppressed in the vicinity of the waveguide of the optical device without deteriorating the thermal dissipation performance. This makes it unnecessary to increase the operating current.

The present invention solves the above-mentioned problem of increasing the operating current of an optical device by improving the thermal conductivity and therefore provides a highly reliable device. According to the present invention, the central part of the electrode of the optical device is coated with a dielectric film. The optical device is mounted junction down to a mounting plate in such a manner that the optical device is in contact with the solder metal of the mounting plate via the one dielectric film. As a result of avoiding direct contact between the solder metal of the mounting plate and the electrode of the optical device, it is possible to suppress reaction between the solder metal and the electrode of the optical device. In addition, since the mounting plate is in contact with the optical device in view of thermal dissipation or thermal conductivity, its thermal conductivity is better than the above-mentioned one provided with the void. As a result, it is possible to suppress temperature rise in the active region during operation of the device and therefore reduce the operating current of the device.

In addition, since the electrode of the device is provided with the layer which suppresses reaction with the solder metal, restrictions on the electrode are mitigated. For example, although such a metal as Ti or Pt is usually deposited to prevent penetration of the solder metal, its thickness can be reduced to a minimum. It is therefore possible to prevent Ti or Pt from causing stress. This reduces the stress which acts on the active layer or optical absorption layer of the device and which deteriorates the reliability of the device.

The largest effect of the present invention is obtained when the present invention is applied to a non-hermetically packaged optical module. In a non-hermetically packaged optical module, external moisture may penetrate the package of the optical module. Water molecules in the package oxidize the solder metal and the surface electrode of the optical device. This oxidization causes increased stresses and diffused metal atoms and therefore deteriorates the optical device. If the present invention is applied, abnormal reaction between the solder metal and the surface electrode of the optical device can be suppressed since the surface of the electrode is protected with a dielectric film.

Note that while the expression "junction down" is used in this specification, "face down" or "upside down" is sometimes used to express the same meaning. Another expression "epi-side down" is sometimes used since the epitaxially grown side is faced to the mounting plate when mounted.

DETAILED DESCRIPTION OF THE PREFERRED EMBODIMENTS

Embodiment 1

Figure 1:
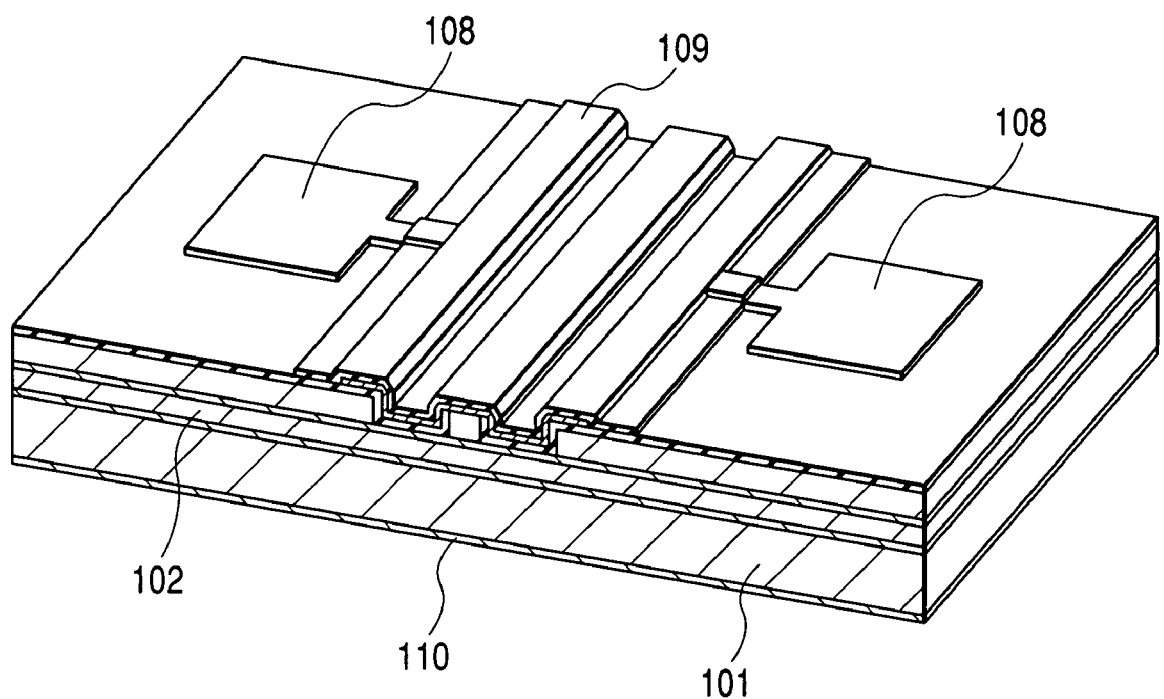
FIG. 1 is a perspective view for explaining a first embodiment of the present invention.
Figure 2:
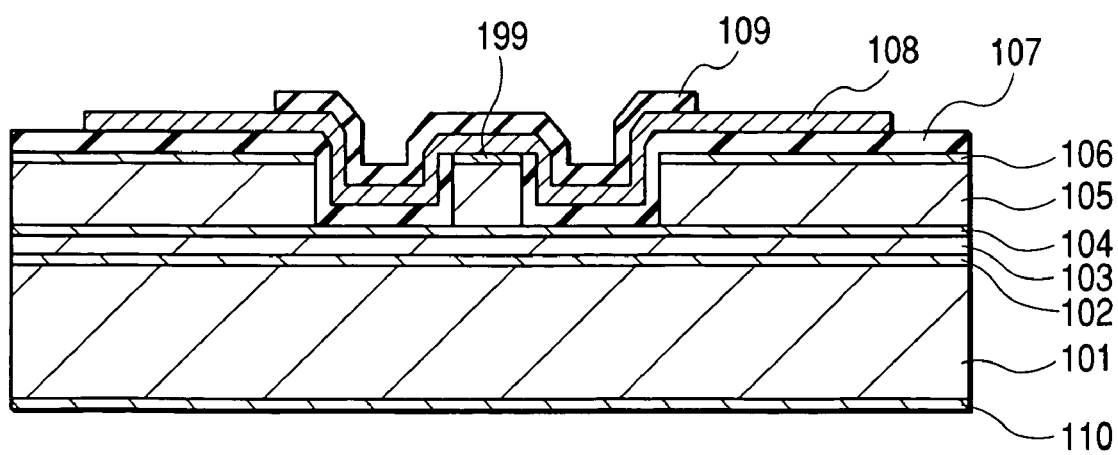
FIG. 2 is a cross sectional view of an optical guide according to the first embodiment.

The following will describe a ridge waveguide type Fabry-Perot (F-P) laser according to a first embodiment of the present invention. FIG. 1 is a perspective view of the first embodiment of the present invention and FIG. 2 is a sectional view of the optical waveguide. The device is a ridge waveguide type laser with an active layer made of InGaAsP-based material. On an n-type InP substrate 101 with a plane direction (100), an n-type InGaAsP optical confinement layer 102, a multi-quantum well layer 103 and a p-type InGaAsP optical confinement layer 104 are formed. Further, on the top of it, a p-type InP clad layer 105 and a p-type InGaAs ohmic contact layer 106 are stacked. The quantum well layer is formed as an active region by stacking seven pairs (periods) of a 6 nm-thick well layer and a 10 nm-thick barrier layer so as to set the oscillating wavelength to about 1300 nm. Although InGaAsP-based material is used as the material of the active region in this embodiment, InGaAlAs-based material may also be used. It is also possible to employ a substrate made of GaAs and an active layer made of InGaNAs-based material. Further, the oscillating wavelength is not limited to 1300 nm. The embodiment may be modified so as to operate at a desired wavelength.

After a desired layer structure is stacked, a ridge waveguide structure is formed by a combination of reactive ion etching (RIE) and wet etching. The RIE operation uses a mixed gas consisting of methane, hydrogen and oxygen while the wet etching operation uses a mixed solution of hydrochloric acid and phosphoric acid. Since the mixed solution of hydrochloric acid and phosphoric acid selectively etches InP only, the wet etching stops automatically at the interface between the InGaAsP optical waveguide layer and the p-type InP clad layer. This forms a ridge waveguide having side walls almost perpendicular to the wafer surface. After the waveguide is formed by the etching, a dielectric silicon oxide ($SiO_2$) film 107 is formed over the surface to passivate the surface. Alternatively, the dielectric film may also be made of silicon nitride (SiN). In addition, the dielectric film may be formed either by thermal CVD (Chemical Vapor Deposition) or plasma CVD. After the surface dielectric film is formed, the dielectric film is removed only from the top surface (reference numeral 199 in FIG. 2) of the ridge type waveguide so as to allow contact with an electrode. Then, a p side electrode 108 is formed by vacuum vapor deposition of Ti (100 nm), Pt (100 nm) and Au (300 nm). After the electrode is deposited, a 100 nm-thick silicon oxide ($SiO_2$) film 109 is formed over the electrode as the second passivation film. Similar to the first passivation film, this passivation film may also be made of SiN either by thermal CVD or plasma CVD.

As shown in FIG. 1, the dielectric film 109 to passivate the electrode is selectively removed so that only the area above the ridge waveguide remains coated. When the device is mounted on a solder metal, only the exposed area of the electrode will come in contact with the solder metal. Since the area to be bonded to the solder metal is distant from the laser waveguide, reaction, if any, between the solder metal and the electrode of the device would have no influence on the ridge waveguide. After the surface passivation dielectric film is formed, the wafer is thinned to about 100 μm before an n-side electrode 110 is formed. Then, after the device is cut out from the wafer so that the device has a resonance length of 300 μm, the device is completed as a semiconductor laser provided with a high reflectance film at each facet. This process is not described here in detail since it is the same as a widely known semiconductor laser fabrication process.

Figure 3:
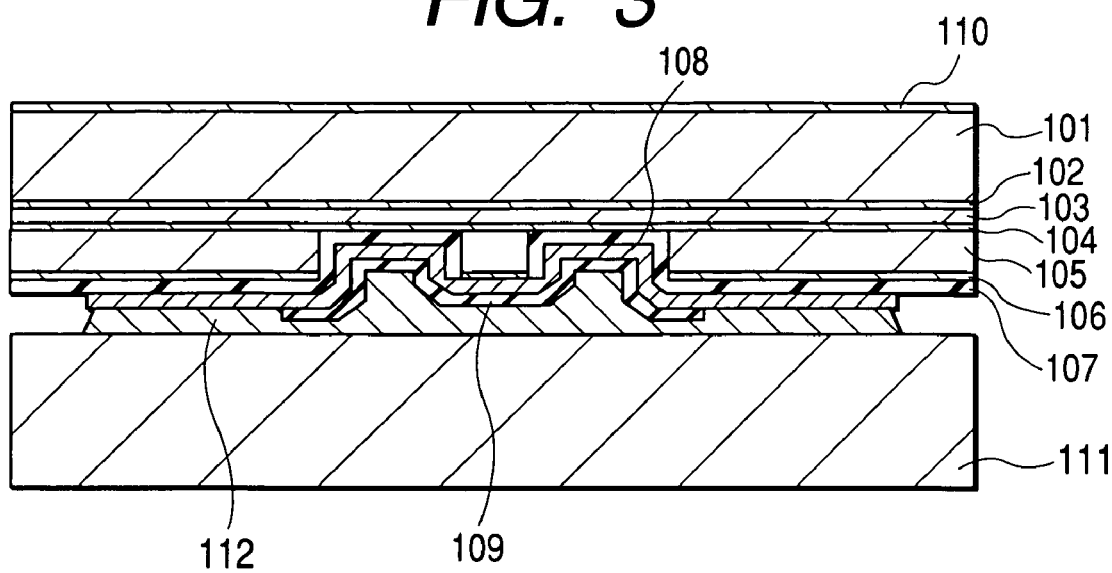
FIG. 3 is a cross sectional view for explaining an example of a mounted device according to the first embodiment.

The completed device was mounted junction down on a mounting plate 111 to evaluate the injection current-light output (I-L) characteristics of the device. FIG. 3 is a sectional view of the mounted device. Over a temperature range of 25° C. to 85° C., the device showed good I-L characteristics. In addition, the operating current is reduced as compared with the structure provided with a void between the laser and the mounting plate. Table 1 shows how the operating current is reduced.

TABLE 1

| Structure | Rise of Temperature at Active Layer [° C.] | Increase of Operating Current [° C.] |
| --- | --- | --- |
| Direct Bonding | 0.29 | 0 |
| Bonding with Void | 4.8 | 9.6 |
| Present Invention | 0.61 | 1.22 |

As indicated in Table 1, the rise of temperature in the active layer is dependent on the thermal conductivity. As compared with the structure having a void between the optical device and the mounting plate, the structure according to the present invention has lower thermal resistance and therefore suppresses the rise of temperature in the active layer. As the result, the operating current at 85° C. is about 10 mA lower than that in the void-formed structure.

Although this embodiment assumes a Fabry-Perot (FP) type laser, it is also possible to apply this embodiment to a DFB semiconductor laser provided with a grating structure. In addition, although the oscillating wavelength is assumed as 1.3 µm, it is also possible to apply this embodiment to lasers for 1.55 µm and other bands.

Although in this embodiment, the electrode of the optical device is coated with SiO2 or SiN to suppress reaction between the electrode metal and the solder metal, the same effect may also be obtained by such metal nitrides as TiN and AlN and such metal silicides as WSi.

Needless to say, it is possible to realize a lower operating current optical module if a mounting plate on which an optical device is mounted according to this embodiment is integrated in the optical module. In addition, the reduced operating current lowers the load of driving the optical module and therefore allows the optical module to be driven by a smaller amplitude voltage IC (Integrated Circuit).

Figure 4:
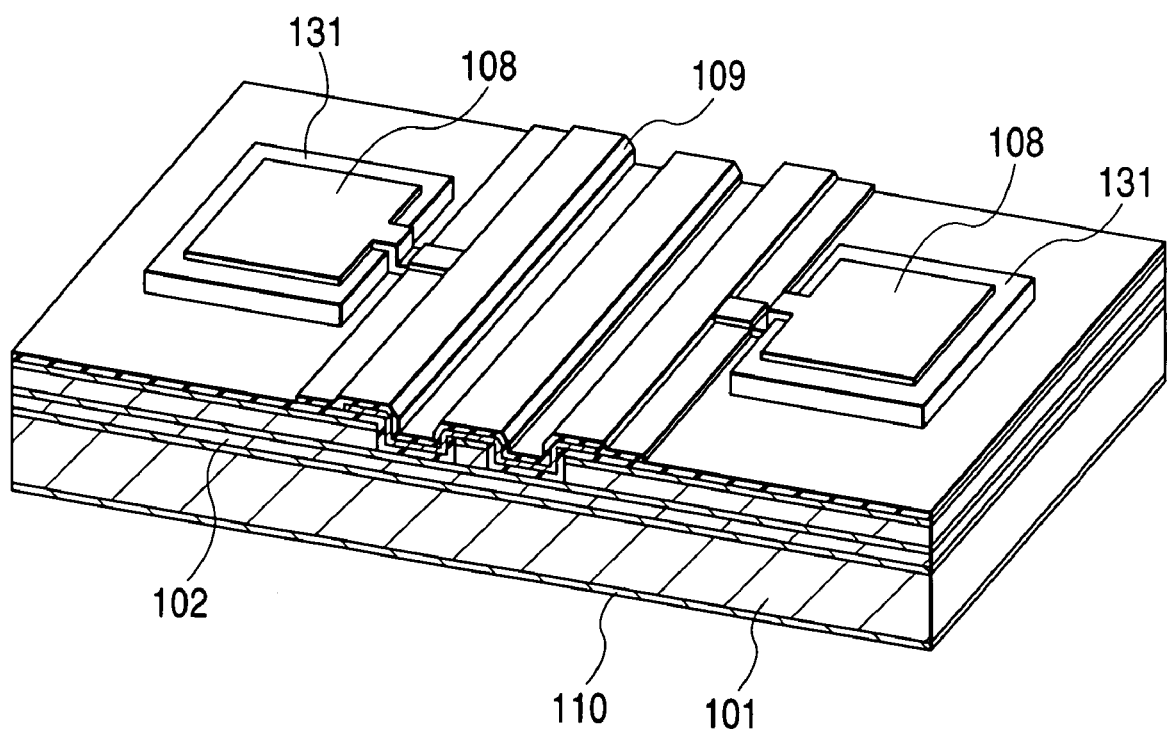
FIG. 4 is a perspective view for explaining an example modifying the first embodiment.
Figure 5:
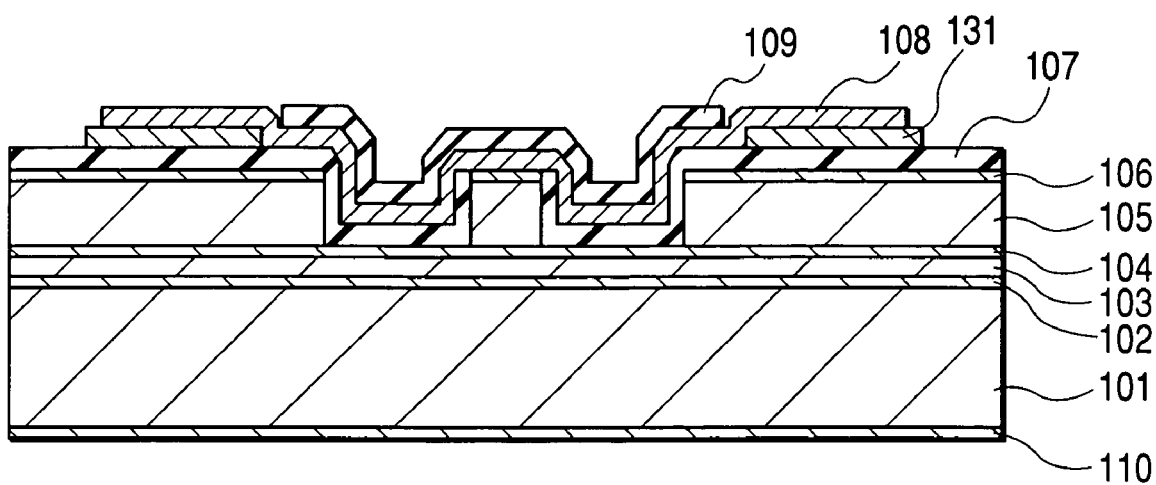
FIG. 5 is a cross sectional view for explaining the example modifying the first embodiment.
Figure 6:
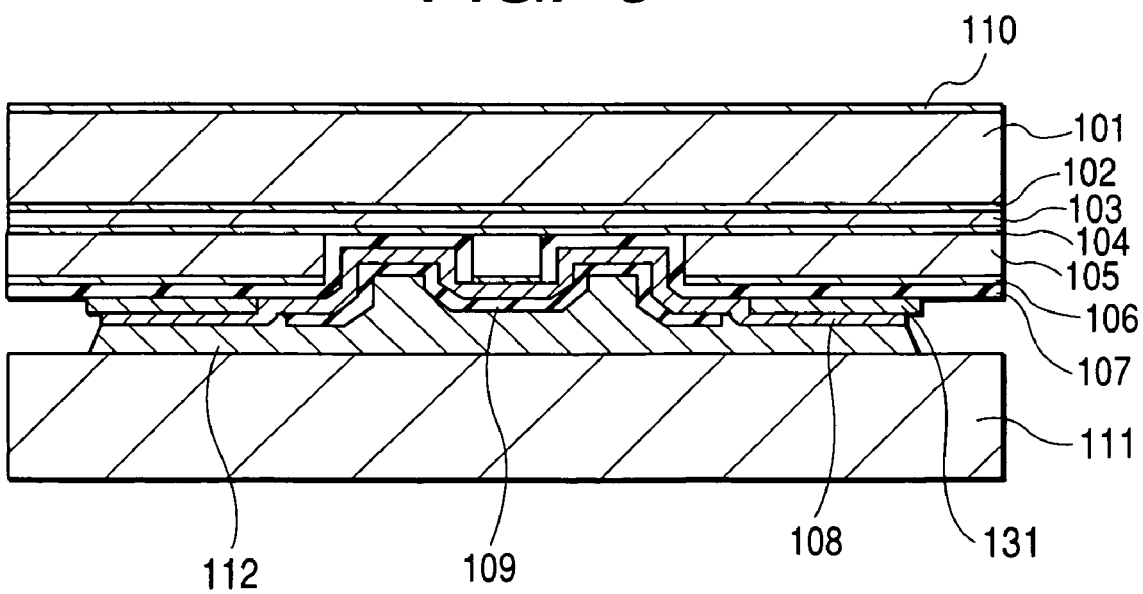
FIG. 6 is a cross sectional view for explaining the example modifying the first embodiment.

FIGS. 4, 5 and 6 shows an example of modifying the first embodiment. In this example, the present invention is applied to a high-speed device. To realize high-speed operation in this high-speed device, a pedestal 131 is inserted to below the p side electrode 108 as the case may be. To reduce the capacitance parasitic to the device, the pedestal 131 is made of a low dielectric constant material. In this example, $SiO_2$ is used to form the pedestal. The present invention can also be applied to this kind of high-speed device.

Embodiment 2

Figure 7:
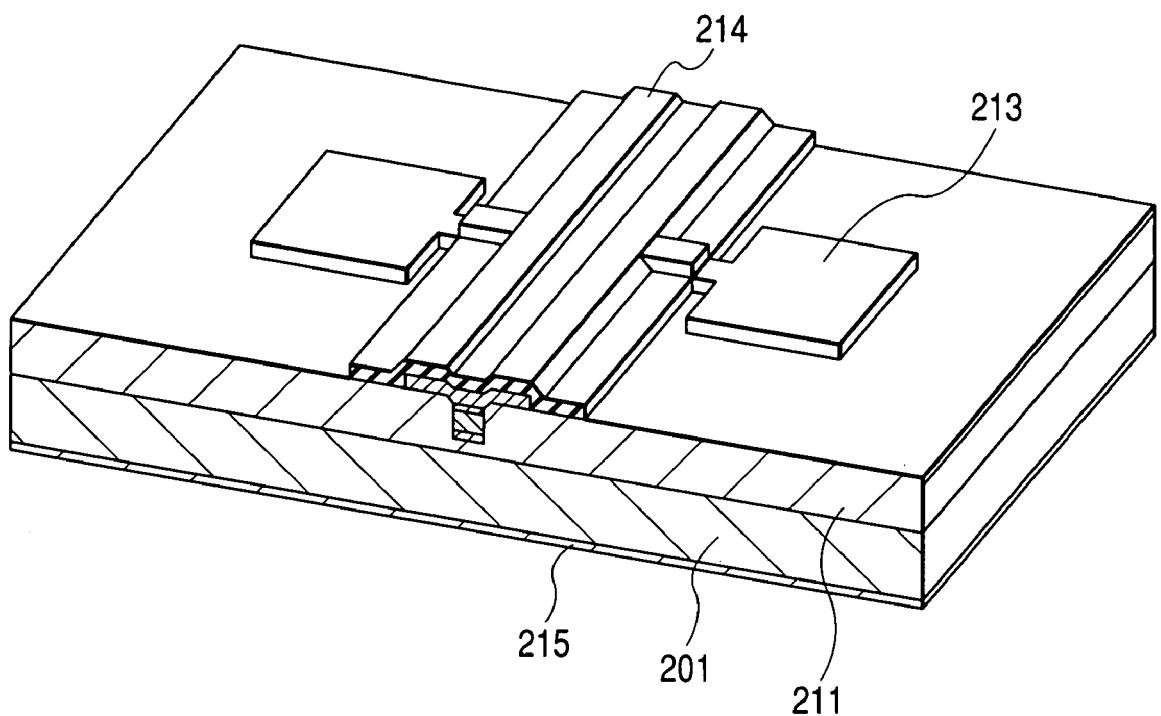
FIG. 7 is a perspective view for explaining a second embodiment of the present invention.
Figure 8:
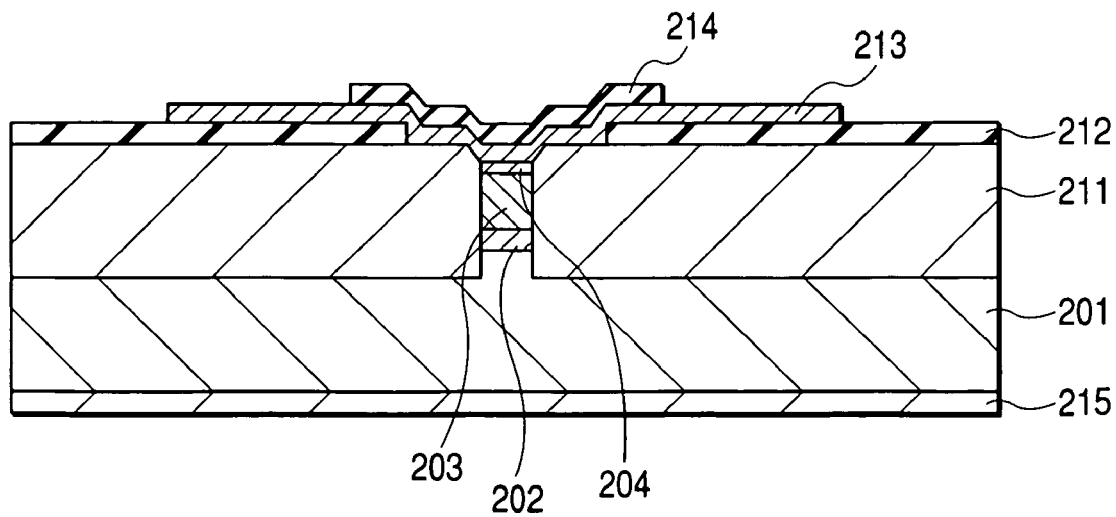
FIG. 8 is a cross sectional view for explaining the second embodiment.

The following describes a BH (Buried Heterostructure) type laser as a second embodiment of the present invention. FIGS. 7 and 8 are its perspective view and sectional view, respectively. The layered structure of the laser is the same as in the first embodiment. On an n-type InP substrate 201 with a plane direction (100), a InGaAsP-based active layer 202, a p type InP clad layer 203 and a p type ohmic contact layer 204 are stacked in this order. The active layer is composed of an InGaAsP optical confinement layer, a multi-quantum well layer and a p type InGaAsP optical confinement layer. The active layer is designed to set the oscillating wavelength to about 1300 nm. The oscillating wavelength must not be set to 1300 nm. The active layer may also be design to have a different oscillating wavelength as desired.

Using the wafer on which a desired layer structure is stacked, a BH type laser is fabricated by a known method. The active region is buried in Fe-added semi-insulating InP 211. After a dielectric film 212 is formed over the wafer surface, an electrode 213 to inject current into the active region (waveguide) is formed. After the electrode is formed, the electrode is partially coated with a dielectric film ($SiO_2$) 214 in order to prevent reaction with the solder metal of a mounting plate onto which the device is to be mounted. Then, through a widely known procedure, the wafer is thinned to about 100 µm and an n-side electrode 215 is formed to complete the device.

Figure 9:
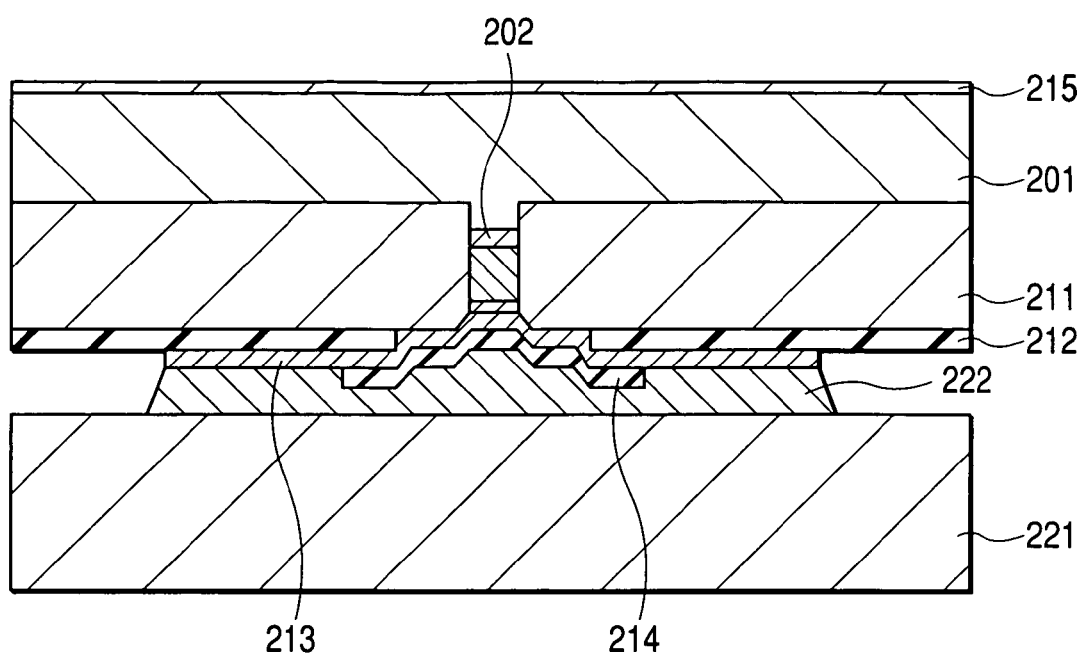
FIG. 9 is a cross sectional view for explaining the second embodiment.

FIG. 9 is a sectional view of the completed device fixed to a mounting plate 221 by a solder metal 222.

Similar to the first embodiment, this embodiment can suppress the temperature rise of the active region and therefore lower the operating current.

Embodiment 3

Figure 10:
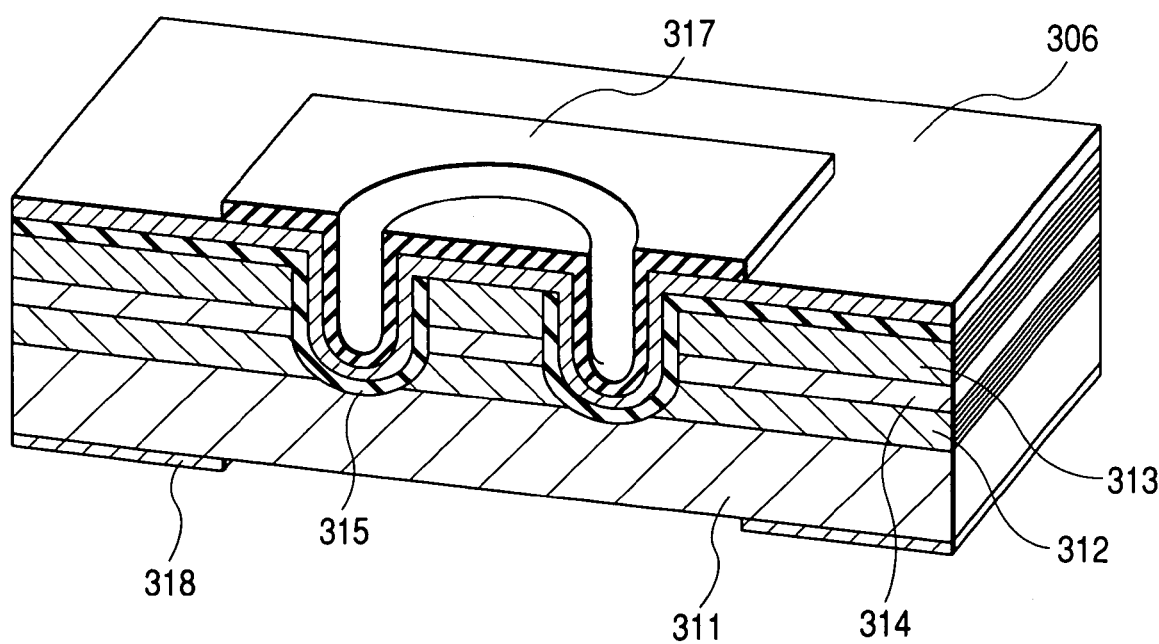
FIG. 10 is a perspective view for explaining a third embodiment of the present invention.
Figure 11:
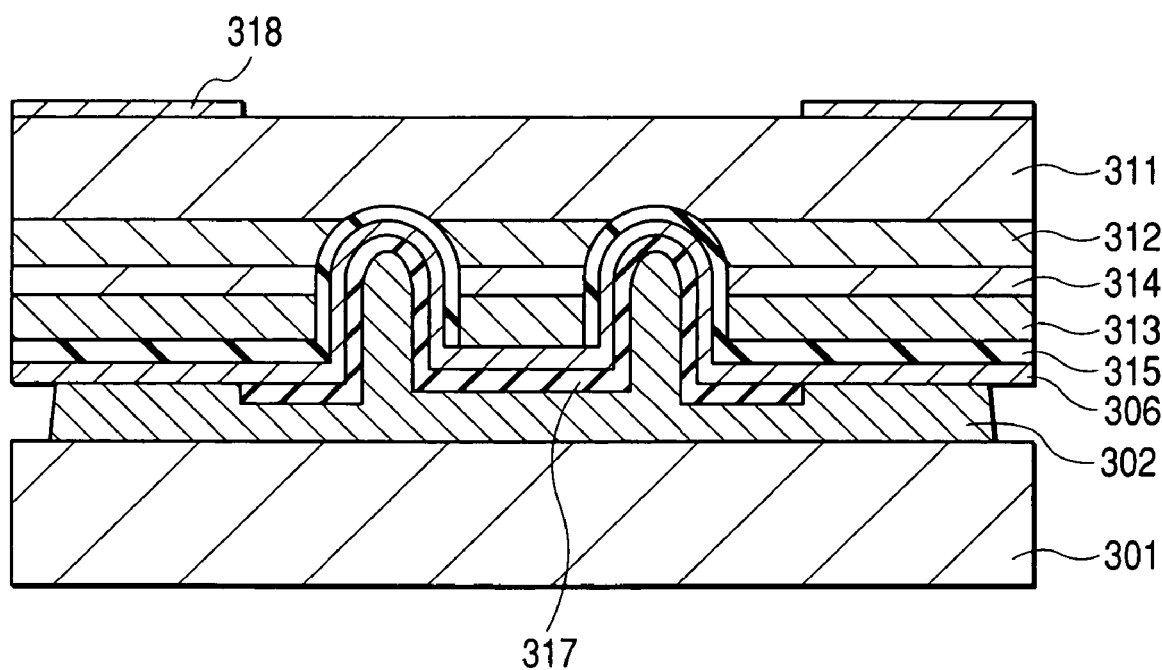
FIG. 11 is a cross sectional view for explaining the third embodiment.

FIGS. 10 and 11 show a VCSEL (Vertical Cavity Surface Emitting Laser) according to a third embodiment of the present invention. FIG. 11 is a sectional view of the vertical cavity surface emitting laser mounted on a mounting plate 301 via a solder metal 302. On an n-type GaAs substrate 311 with a plane direction (100), Bragg reflectors 312 and 313 and an active layer 314 are stacked. The structure consisting of the active region and Bragg reflectors is the same as a widely known structure and therefore not described here in detail. After the layered structure is formed, a current confinement structure, a surface dielectric film 315 and a p-side electrode 316 are formed. Further, the electrode is partially coated with a dielectric film 317 in order to prevent reaction with the solder metal of a mounting plate onto which the device is to be mounted. This coating of the electrode with the dielectric film 317 can prevent reaction between the electrode and the solder metal in the vicinity of the current confinement region.

Figure 12:
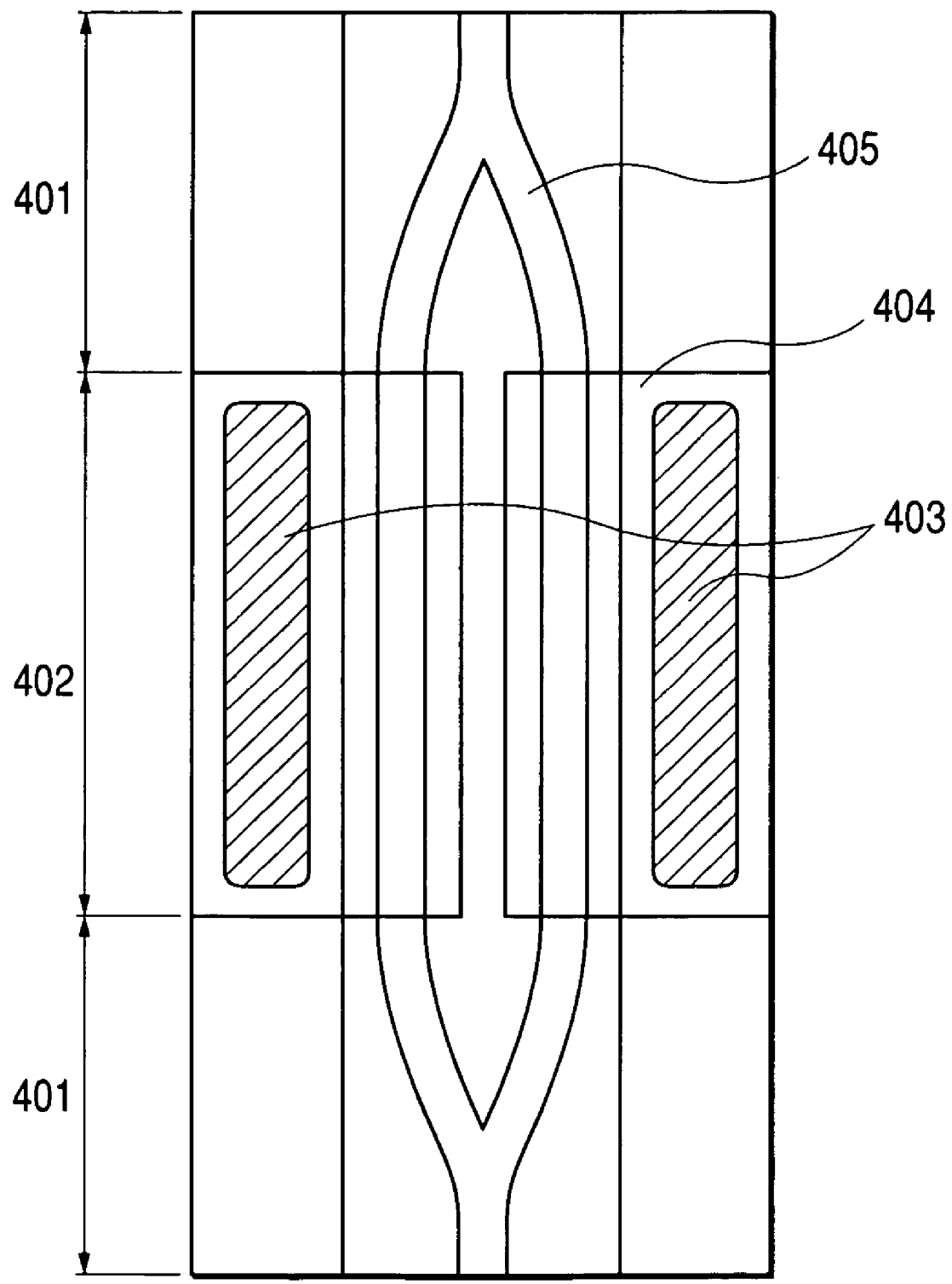
FIG. 12 is a plan view for explaining a Mach Zehnder type optical modulator embodying the present invention.
Figure 13:
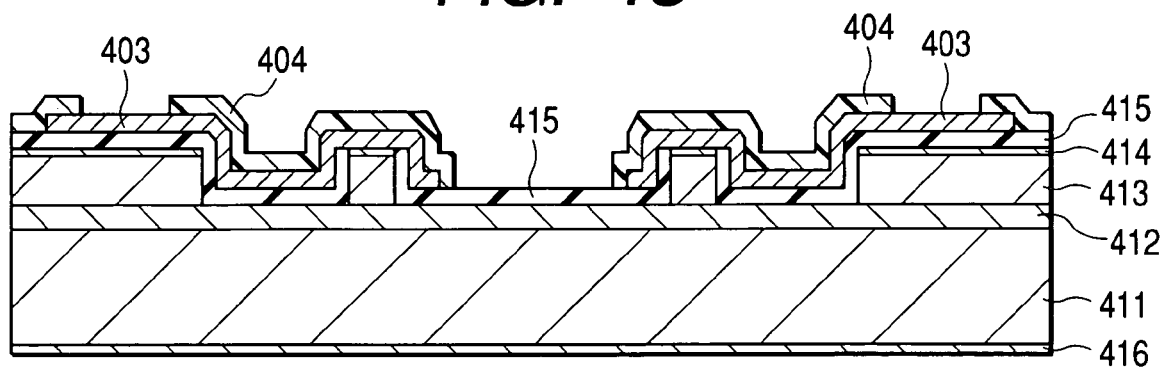
FIG. 13 is a cross sectional view for explaining the optical modulator of FIG. 12.
Figure 14:
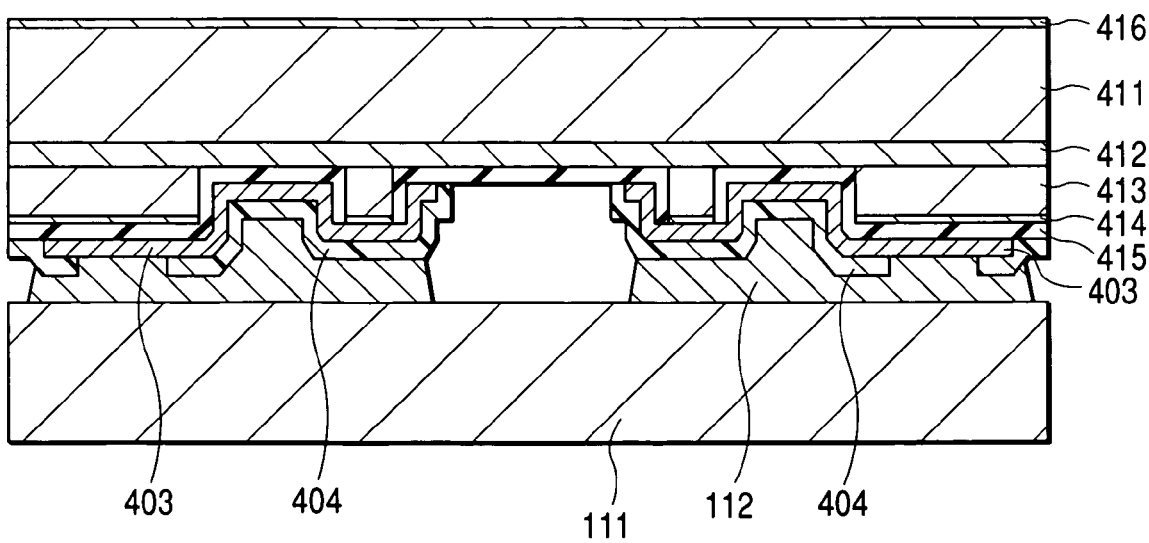
FIG. 14 is a cross sectional view for explaining the optical modulator of FIG. 12.

Although three embodiments have been mentioned, the structure according to the present invention can also be applied to other optical devices. For example, while embodiments 1 and 2 concern semiconductor lasers, they can also be applied to EA (Electro-Absorption) modulators. Since as widely known, application to an EA modulator is implemented in almost the same embodiment as illustrated in FIGS. 1 to 6, its embodiment is not described here in detail. An EA modulator in accordance with the present invention can be embodied by modifying the optical waveguide layer structure of the first or second embodiment to a preferable structure as an EA modulator. Layered structures preferable as an EA modulator are already known widely. In addition, as shown in FIGS. 12, 13 and 14, the present invention can also be applied to Mach Zehnder type optical modulator. The structure shown in FIGS. 12 to 14 can be fabricated by the same procedure as the first embodiment. As understood easily by analogy, a Mach Zehnder type optical modulator provided with branching waveguides can be fabricated through the same procedure. Since this layered structure is widely known, it is not described here in detail. Further, needles to say, the present invention can be applied not only to discrete lasers and modulators but also to modulator-integrated semiconductor lasers.

In addition, although a $SiO_2$ or SiN dielectric film is used as a layer to prevent reaction between the electrode and the solder metal, this layer may also be made of a metal nitride such as TiN.

According to the present invention, it is possible to provide a low price and high reliability semiconductor laser module. Using an optical module where an optical device is mounted according to the present invention, it is possible to provide a low power consumption and high speed optical transmission unit.

To facilitate understanding of the drawings, the major numerals are described below:

101 . . . n-type InP substrate, 102 . . . n-type InGaAsP optical confinement layer, 103 . . . Multi-quantum well active layer, 104 . . . p-type InGaAsP optical confinement layer, 105 . . . p-type InP clad layer, 106 . . . p-type InGaAs ohmic contact layer, 107 . . . Surface dielectric film, 108 . . . p-side electrode, 109 . . . Electrode protection dielectric film, 110 . . . n-side electrode, 111 . . . Mounting plate, 112 . . . Solder metal, 131 . . . Pedestal, 201 . . . n-type InP substrate, 202 . . . InGaAsP-based active layer, 203 . . . p-type InP clad layer, 204 . . . p-type InGaAs ohmic contact layer, 211 . . . Semi-insulating InP, 212 . . . Surface dielectric film, 213 . . . p-side electrode, 214 . . . Electrode protection dielectric film, 215 . . . n-side electrode, 221 . . . Mounting plate, 222 . . . Solder metal, 301 . . . Mounting plate, 302 . . . Solder metal, 311 . . . n-type GaAs substrate, 312 . . . n-type Bragg reflector, 313 . . . p-type Bragg reflector, 314 . . . Active layer, 315 . . . Surface dielectric film, 316. p-side electrode, 317 . . . Electrode protection dielectric film, 318 . . . n-side electrode, 401 . . . Branching waveguide, 402 . . . Modulator, 403 . . . Electrode, 404 . . . Electrode protection dielectric film, 411 . . . n-type InP substrate, 412 . . . InGaAsP optical waveguide, 413 . . . p-type InP clad layer, 414. p-type InGaAs ohmic contact layer, 415 . . . Surface dielectric film, 416 . . . n-side electrode.

What is claimed is:

1. A semiconductor optical device mounting structure, comprising:
    a semiconductor laser device and a mounting plate on which a second electrode is formed,
    wherein said semiconductor laser device comprises
    an active layer,
    a clad layer formed over said active layer,
    a surface dielectric film formed over said active layer,
    a first electrode which is formed over said clad layer and is elongated toward a peripheral region of said semiconductor laser device, and
    an electrode protection dielectric film which is formed over said surface dielectric film and said clad layer,
    wherein said surface dielectric film is removed at a top surface of an active region of said semiconductor laser device,
    wherein said electrode protection dielectric film is selectively removed so that an area above the active region remains coated, and
    wherein said semiconductor laser device is mounted on said mounting plate in junction down form by mounting said first electrode of said semiconductor laser device on the second electrode of said mounting plate by using solder metal.

2. A semiconductor optical device mounting structure according to claim 1, wherein said semiconductor laser device is one selected from a group consisting of a ridge type device, a buried type device, and vertical cavity surface emitting type device.

3. A semiconductor optical device mounting structure, comprising:
    a ridge type semiconductor laser device and a mounting plate on which a second electrode is formed,
    wherein said ridge type semiconductor laser device comprises
    an active layer,
    a clad layer formed over said active layer,
    a surface dielectric film formed over said active layer,
    a first electrode of a p-side electrode which is formed over said clad layer and is elongated toward a peripheral region of said ridge type semiconductor laser device, and
    an electrode protection dielectric film which is formed over said clad layer,
    wherein said surface dielectric film is removed at a top surface of a ridge type waveguide,
    wherein said electrode protection dielectric film is selectively removed so that only the area above the ridge type waveguide remains coated, and
    wherein said ridge type semiconductor laser device is mounted on said mounting plate in junction down form by mounting said p-side electrode of said ridge type semiconductor laser device on the second electrode of said mounting plate by using solder metal.

4. A mounting method of a semiconductor optical device mounting structure, comprising:
    preparing a semiconductor laser device and a mounting plate on which a second electrode is formed, wherein said semiconductor laser device comprises:
    an active layer,
    a clad layer formed over said active layer,
    a surface dielectric film over said active layer,
    a first electrode which is formed over said clad layer and is elongated toward peripheral region of said semiconductor laser device, and
    an electrode protection dielectric film which is formed over said surface dielectric film and said clad layer;
    wherein
    said surface dielectric film is removed at a top surface of an active region of said semiconductor laser device,
    said electrode protection dielectric film is selectively removed so that the area above the active region remains coated, and
    mounting said semiconductor laser device on said mounting plate in junction down form by mounting said first electrode of said semiconductor laser device on the second electrode of said mounting plate by using solder metal.

5. Mounting method of a semiconductor optical device, comprising:
    preparing a ridge type semiconductor laser device and a mounting plate on which a second electrode is formed; said ridge type semiconductor laser device comprising;
    an active layer,
    a clad layer formed over said active layer,
    a surface dielectric film formed over said active layer,
    a first electrode of a p-side electrode which is formed over said clad layer and is elongated toward peripheral region of said ridge type semiconductor laser device, and
    an electrode protection dielectric film which is formed over said clad layer,
    wherein
    said surface dielectric film is removed at a top surface of a ridge type waveguide, and
    said electrode protection dielectric film is selectively removed so that only the area above the ridge waveguide remains coated, and
    mounting said ridge type semiconductor laser device on said mounting plate in junction down form by mounting said p-side electrode of said ridge type semiconductor laser device on the second electrode of said mounting plate by using solder metal.

* * * * *